United States Patent [19]

Ettenberg et al.

[11] 4,048,627
[45] Sept. 13, 1977

[54] ELECTROLUMINESCENT SEMICONDUCTOR DEVICE HAVING A RESTRICTED CURRENT FLOW

[75] Inventors: Michael Ettenberg, Freehold, N.J.; Harry Francis Lockwood, New York, N.Y.

[73] Assignee: RCA Corporation, New York, N.Y.

[21] Appl. No.: 632,812

[22] Filed: Nov. 17, 1975

[51] Int. Cl.² .......................................... H01L 33/00
[52] U.S. Cl. ........................................ 357/17; 357/15; 357/16; 357/18; 357/56
[58] Field of Search ................. 357/17, 18, 15, 56, 357/16; 331/94.5 H

[56] References Cited

U.S. PATENT DOCUMENTS

| 3,849,790 | 11/1974 | Gottsmann et al. | 357/18 |
| 3,914,785 | 10/1975 | Ketchols | 357/63 |
| 3,940,785 | 2/1976 | Genesi | 357/15 |

OTHER PUBLICATIONS

M. B. Panish, "Hetrostructure Injection Lasers", Bell Laboratories Record, Nov. 1971, pp. 299–304.

Primary Examiner—Michael J. Lynch
Assistant Examiner—James W. Davie
Attorney, Agent, or Firm—H. Christoffersen; B. E. Morris; Daniel N. Calder

[57] ABSTRACT

A body of semiconductor material has opposed end surfaces, opposed side surfaces extending to the end surfaces and opposed first and second contact surfaces which are substantially perpendicular to the end and side surfaces. The body includes a substrate having on a surface thereof a mesa shaped active region which extends to the first contact surface. The active region has side surfaces which are spaced from the side surfaces of the body. Also on the substrate are passive regions which extend from the side surfaces of the active region to the first contact surface and side surfaces of the body. The active region has a P-N junction therein. The passive regions each include a plurality of contiguous passive layers having, P-N junctions therebetween. The P-N junctions of the passive regions extend from the first contact surface to the side surface of the body. Metallic electrodes are on each of the contact surfaces. The passive regions serve to restrict current flow to the active region.

11 Claims, 2 Drawing Figures

ELECTROLUMINESCENT SEMICONDUCTOR DEVICE HAVING A RESTRICTED CURRENT FLOW

BACKGROUND OF THE INVENTION

The present invention relates to electroluminescent semiconductor devices and more particularly to an electroluminescent semiconductor device having a restricted current flow.

Electroluminescent semiconductor devices, in general, are bodies of a single crystalline semiconductor material which, when biased with a current, emits light, either visible or not visible, through the recombination of pairs of oppositely charged carriers. Typically, electroluminescent semiconductor devices are devices such as light emitting diodes and lasers. Such devices generally include regions of opposite conductivity types forming a P-N junction therebetween. When the junction is properly biased, charge carriers of one type are injected from one of the regions into the other where the predominant charge carriers are of the opposite conductivity type so as to achieve the light generating recombination.

To improve the operating characteristic of the electroluminescent semiconductor device it has been found desirable to both limit the width of the device's recombination region, i.e. the dimension of the recombination region between the side surfaces of the body, and to limit the flow of current, through the body, to only the recombination region. Various structures of electroluminescent semiconductor devices have been designed to achieve the restriction of current flow, but such devices have had the disadvantage that they were difficult to fabricate. It would be most desirable to have an electroluminescent semiconductor device with restricted current flow which would be easy to fabricate.

SUMMARY OF THE INVENTION

An electroluminescent semiconductor device having restricted current flow includes a body of semiconductor material having opposed end surfaces, opposed side surfaces extending to the end surfaces, and opposed contact surfaces substantially perpendicular to the end surfaces and the side surfaces. The body includes an active region capable of generating electroluminescence. The active region is in the form of a mesa and extends to one of the contact surfaces. The active region has sides which are spaced from the side surfaces of the body. The body also includes passive regions which extend from the side surfaces of the active region to the side surface of the body and the one contact surface. The passive regions each have therein a P-N junction extending from the one contact surface to a side surface of the body.

DETAILED DESCRIPTION OF THE INVENTION

Figure 1:
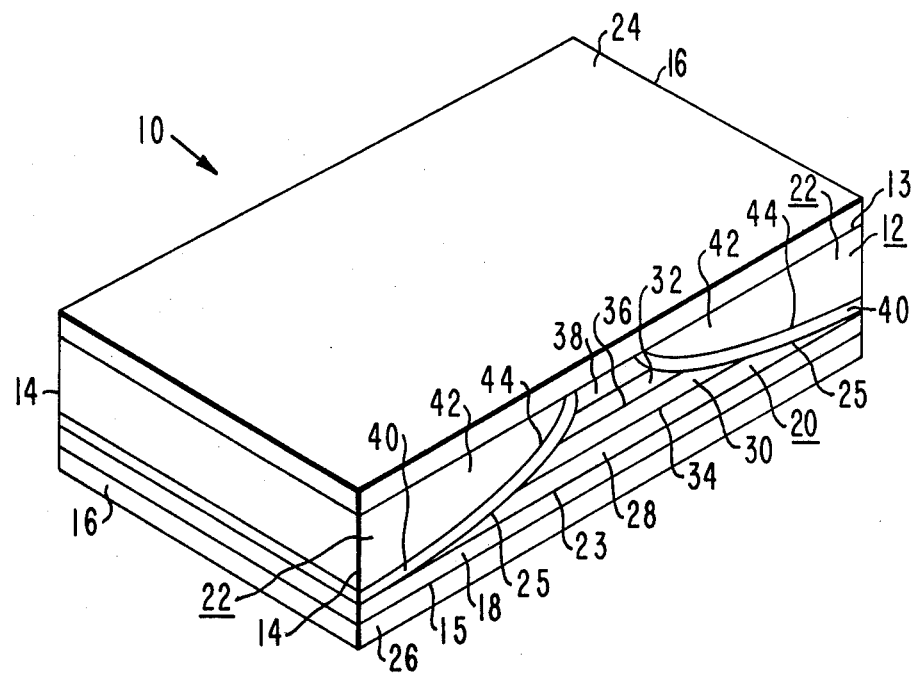
FIG. 1 is a perspective view of a first embodiment of an electroluminescent semiconductor device of the present invention.

Referring initially to FIG. 1, a first embodiment of the electroluminescent semiconductor device of the present invention is generally designated as 10. The semiconductor electroluminescent device 10 of the present invention may be either a light emitting diode or a laser. For the purposes of detailing the present invention it is assumed that device 10 is a laser. The semiconductor device 10 includes a body 12 of single crystalline semiconductor material in the form of a rectangular parallelepiped. The body 12 has a pair of opposed, parallel end surfaces 14, opposed side surfaces 16 extending between the end surfaces 14, and opposed first and second contact surfaces 13 and 15 which are substantially perpendicular to both the side surfaces 16 and end surfaces 14. The end surfaces 14 are reflective to form a Fabry-Perot cavity and at least one of the end surfaces 14 is partially transmissive so as to allow emission of the light generated in the semiconductor device 10.

The semiconductor body 12 includes therein a substrate 18 having a surface 23, with an active region 20 on the surface 23 of the substrate 18, extending to a portion of said first contact surface 13. By the term active region 20 it is meant the region of the body 12 to which the current flow of the device 10 is substantially confined between the first contact surface 13 and the surface 23 of the substrate 18, and having at least a portion wherein electroluminescence is generated. The active region 20 is in the form of a mesa structure extending from one end surface 14 to the other end surface 14 and having sloping sides 25 which flare out as they extend from the first contact surface 13 to the surface 23 of the substrate 18. Passive regions 22 are in contact with the substrate 18 and the sloping side surface 25 of the active region 20, and extend to the side surface 16 and first contact surface 13.

On the first contact surface 13 in contact with both the active region 20 and passive region 22 is a first metallic electrode 24. Opposite the first metallic electrode 24 and on the second contact surface 15 is a second metallic electrode 26.

The substrate 18 is of a semiconductor material suitable for the growth of the semiconductor materials of the active region 20 and passive regions 22. Also, the substrate 18 should be of a semiconductor material of high conductivity, so as to make easy ohmic contact to the active region 20.

For the purpose of describing the electroluminescent semiconductor device 10 of the present invention the active region 20 is a double heterostructure. The active region 20 includes a first layer 28 of one conductivity type, a second layer 32 of the opposite conductivity type spaced from the first layer 28, a third layer 30 between and in contact with both first and second layers 28 and 32, and a cap layer 38 on a surface of the second layer 32 opposite the third region 30. The substrate 18 is of the same conductivity type as the first layer 28 so as not to form a P-N junction with the active region 20. The third layer 30 is the recombination region of the active region 20 and is thus of a semiconductor material capable when biased of generating electroluminescence, such as the materials of the III-V group and in particular gallium arsenide, GaAs. The third layer 30 can be of the same conductivity type as either the first or second layers 28 and 32 but it is assumed for purposes of describing the present invention that it is of the same conductivity type as the first layer 28. The first and second layers 28 and 32 are of semiconductor materials having a higher bandgap energy and lower index of refraction than the semiconductor material of the third layer 30. As a consequence of the first and second layers 28 and 32 being of semiconductor materials having the properties herein described, there will be optical confinement of the radiation and electrical confinement of free carriers generated in the third layer 30 at the junctions 34 and 36. The junctions 34 and 35 are heterojunctions. With the third layer 30 of GaAs it is preferred that the first layer 28 be $Al_xGa_{1-x}As$ where $0<x<1$ and the second layer 32 be $Al_yGa_{1-y}As$ wherein $0<y<1$ and it is further assumed for purposes of explaining the present invention that the third and first layers 30 and 28 are of N type conductivity while the second layer 32 is of P type conductivity. Since the third layer 30 and second layer 32 are of opposite conductivity types, the heterojunction 36 is a P-N junction.

Electrical contact to the active region 20 is made at the cap layer 38 and at the second layer 32. Preferably the cap layer 38 is of a highly doped semiconductor material making it ideally suited for forming an ohmic contact with the first metallic contact 24. As is well known in the art the more highly doped the semiconductor material is the better the chances for forming an ohmic contact. Also the semiconductor material of the cap layer 38 should be of a semiconductor material having good lattice matching with the material of the second layer 32 and be of the same conductivity type as the second layer 32 so that the cap layer 38 does not form a P-N junction with the second layer 32. Typically a material having the properties desired with respect to the example herein described would be P+ type gallium arsenide.

The passive region 22 includes a first passive layer 40 of a semiconductor material of one conductivity type with a second passive layer 42 of the opposite conductivity type on the first passive layer 40 having a P-N junction 44 therebetween. The first passive layer 40 extends from a portion of the first contact surface 13, where it is in contact with the first metallic electrode 24, along and in contact with both the sloping surface 25 of the active region 20 and the surface 23 of the substrate 18, and extends to a portion of the side surface 16. The second passive layer 42 is on the first passive layer 40, spaced from the active region 20 and substrate 18, and extends to the remaining portion of the first contact surface 13 and the remaining portion of the side surface 16. Typically, for reasons to be subsequently explained the first passive layer 40 is very thin between the active region 20 and second passive layer 42, i.e., in the range of about 1000A.

The first passive layer 40 and second passive layer 42 are of the same semiconductor material consequently the P-N junction 44 is a homojunction. The semiconductor material of both the first and second passive layers 40 and 42 is of a material having a higher bandgap energy and lower index of refraction than the semiconductor material of the third layer 30, thereby resulting in optical confinement where the passive region 22 interfaces with the third layer 30 along the sloping sides 25.

It is preferable that the semiconductor material of the passive region 22 be only slightly doped, i.e., less than $1 \times 10^{17}$ carriers/cm$^{-3}$, so that current from the first electrode 24 is more likely to flow to the highly doped cap layer 38 of the active region 20 than to the lower doped passive region 22.

It is well known in the semiconductor field that when certain metals are contacted to certain semiconductor materials a Schottky barrier is formed. A Schottky barrier is a type of surface barrier junction. It is also well known that a better Schottky barrier can be made to N-type semiconductor material than to P-type material. For reasons that will subsequently be discussed a Schottky barrier at the interface of the first passive layer 40 and the first metallic electrode 24 would be most desirable. Consequently, the first passive layer 40 would be of N-type conductivity. With the first passive layer 40 of N-type conductivity the second passive layer 42 would be of P-type conductivity.

A semiconductor material fulfilling the requirements of the passive region 22 as stated, with respect to the example herein recited, is $Al_zGa_{1-z}As$ where $0.4<z<1$. Furthermore for the example herein stated the substrate 18 is of N-type gallium arsenide.

Typically, both first and second metallic electrodes 24 and 26 are of a metal or metals having good electrical conducting properties. For example the first electrode 24 may includes a layer of chromium on the active region 20 and passive regions 22, and the second electrode 26 may include a layer of chromium on the surface 23 of the substrate 18, with a layer of gold on each of the chromium layers of the first and second electrodes 24 and 26. As is well known in the art, gold is an excellent conductor of electrical current while the layer of chromium makes possible better adhesion of the gold to the semiconductor body 12.

The principle function of the passive region 22 is to restrict the flow of current from the first metallic electrode 24 to the surface 23 of the substrate 18 to only the active region 20. It should be noted that the distance between the opposed side surfaces 16 is considerably wider than the distance between the sloping side surfaces 25 of the active region 20 at the first contact surface 13.

In the operation of the electroluminescent semiconductor device 10 a forward biased voltage is applied to the device 10 by placing the first metallic electrode 24 at a positive potential while the second metallic electrode 26 is at a negative potential. Upon the application of the forward bias voltage to the active region 20, electrons are injected from the first layer 28 into the third layer 30, and holes from the second layer 32 are injected into the third layer 30. The injected electrons and holes undergo radiation recombination in the third layer 30 with the result that light is generated in the third layer 30. Since the third layer 30 has an index of refraction at the emitting light energy, higher than the index of refraction of each of the first and second layers 28 and 32 and the first passive layer 40, almost the entire portion of the radiation generated in the third layer 30 is confined within the third layer 30.

Current is confined to the active region 20 because of a number of properties of the passive regions 22 which have previously been discussed. First, both the first and second passive layers 40 and 42 of the passive region 20 are lightly doped. As is well known in the semiconductor art current is more likely to flow through highly doped semiconductor material, such as the highly doped cap layer 38, than the lightly doped first and second passive layers 40 and 42. Secondly, the N-type first passive layer 40 forms a Schottky barrier with the first metallic electrode 24. It is well known in the art that it is more difficult for current to flow through this Schottky barrier than for current to flow into the cap layer 38 of the active region 20, which forms an ohmic contact with the first metallic electrode 24. Even if some current should leak through the Schottky barrier as previously stated the N-type first passive layer 40 is very thin so that the amount of leakage current would be insignificant. Thirdly, it is well known in the semiconductor art that the voltage required to forward bias a P-N homojunction to the point of injection current flow is determined by the bandgap energy of the semiconductor material of the P-N junction. If the P-N junction is a heterojunction, where the semiconductor material on both sides of the P-N junction have different bandgap energy, the forward bias voltage for generating current flow is determined by the lower bandgap energy. In the semiconductor device 10 the semiconductor material on either side of the P-N homojunction 44 is of a higher bandgap energy than the semiconductor material of the third layer 30 at P-N heterojunction 34. Therefore, when a biasing voltage is applied across the electroluminescent semiconductor device 10 only the P-N heterojunction 34 is forward biased, the P-N homojunction 44 is not forward biased sufficiently to generate current flow. Consequently, current will not flow from the first metallic electrode 24 into the second passive layer 42 and across the P-N junction 44. It is a combination of these three characteristics of the passive region 22 which substantially restricts the current flow to the active region 20.

The electroluminescent semiconductor device 10 maybe made by first epitaxially growing on the entire substrate 18 the layers of the active region 20. After deposition the greater portion of these active layers are removed by etching and then epitaxially depositing on the substrate 18, where the active layers are etched, the passive region 22. Initially the electroluminescent semiconductor device 10 is fabricated epitaxially by depositing sequentially a layer of semiconductor material equivalent to the first layer 28 on a surface of the substrate 18, a layer of semiconductor material equivalent to the semiconductor material of the third layer 30, a layer of semiconductor material equivalent to the semiconductor material of the second layer 32 and finally a layer of semiconductor material equivalent to the semiconductor material of the cap layer 38. These layers maybe sequentially deposited on the substrate 18 by liquid phase epitaxy by using the method and apparatus described in U.S. Pat. No. 3,897,281, issued July 29, 1975 to S. L. Gilbert et al, entitled "Method For Epitaxially Growing A Semiconductor Material On A Substrate From The Liquid Phase." In U.S. Pat No. 3,897,281 the liquid phase epitaxy method as described involves placing in the wells of a refractory furnace boat charges of the semiconductor material and conductivity modifiers to be deposited. The substrate 18 is placed in a slide which extends longitudinally through the boat and across the bottom of the wells. The boat and its contents are heated to a predetermined temperature and the charge becomes molten. After reaching the predetermined temperature the slide is moved into a first well and the furnace contents are cooled. During the cooling of the molten charge the semiconductor material is deposited onto the substrate. The substrate is sequentially moved into the remaining wells while the furnace contents are cooled for the further deposition of the semiconductor material in the wells.

After the deposition of the four semiconductor layers the substrate with the semiconductor layers is removed from the furnace boat. Then by masking and by etching techniques well known in the art a portion of the four semiconductor layers is removed so as to form the mesa structure of the active region 20. A mask is then deposited on the surface of the active region 20 opposite the substrate 18 by techniques well known in the art. Typically, the mask is of carbon or an oxide such as silicon dioxide or aluminum oxide, 0.1 to 0.2 micron in thickness. Next, the substrate 18 with the mesa structure 20 is again placed in the furnace boat for the deposition of the first and second passive layers 40 and 42 of the passive region 20. The mask prevents the deposition of passive layers 40 and 42 onto that surface of the active region 20 opposite the substrate 18. After the deposition of the second passive layer 20 the wafer is removed from the furnace boat for both removal of the mask by either etching, sputtering or ion milling and for lapping and polishing of the wafer. Fabrication of the electroluminescent semiconductor device 10 is completed by state of the art evaporation of the metal or metals forming the first and second metallic electrodes 24 and 26.

Figure 2:
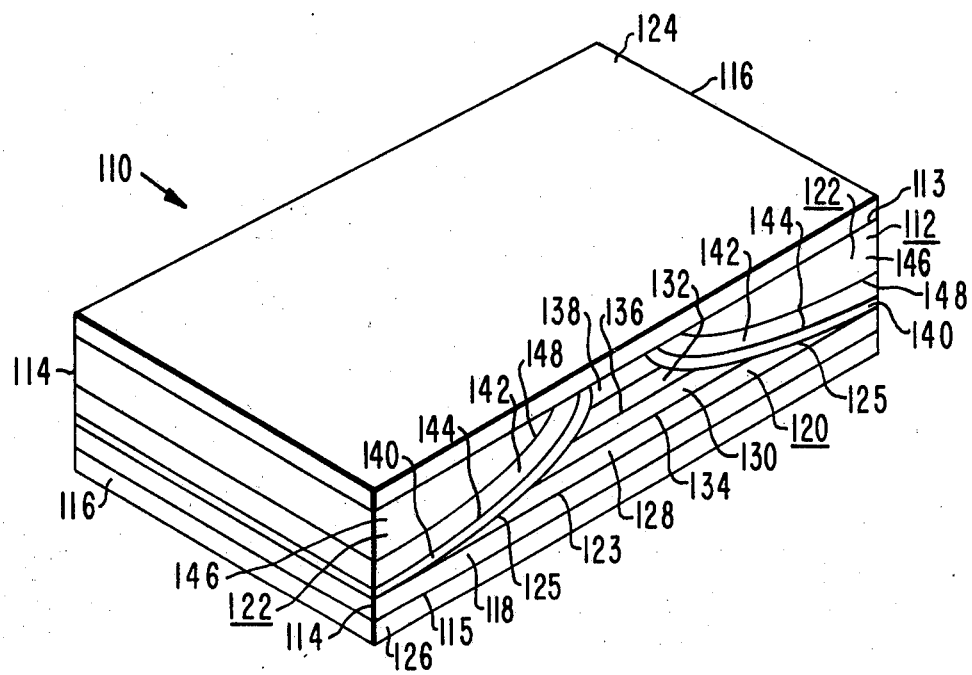
FIG. 2 is a perspective view of a second embodiment of the electroluminescent semiconductor device of the present invention.

Referring to FIG. 2, a second embodiment of the electroluminescent semiconductor device of the present invention is generally designated as 110. The semiconductor device 110 is similar to the semiconductor device 10, shown in FIG. 1, in that it includes a body 112 of semiconductor material having opposed end surfaces 114, opposed side surfaces 116 and a first contact surface 113 spaced from and opposite a second contact surface 115. The body 112 includes a substrate 118, and extending from a surface 123 of the substrate 118 to the first contact surface 113, a mesa shaped active region 120 having sloping side surfaces 125 which flare out as they extend from the first contacting surface 113 toward the substrate surface 123. On the sloping side surfaces 125 are the passive regions 122, with each passive region 122 extending to side surface 116 and the first contact surface 113. A first metallic electrode 124 is on the first contact surface 113 and a second metallic electrode 126 is on the second contact surface 113. The active region 120 includes a first layer 128, a second layer 132 spaced from the first layer 128, a third layer 130 between and contiguous to both first and second layers 128 and 132 and a cap layer 138 is on the second layer 132. The junctions 134 and 136 between the third layer 130 and each of the first and second layers 128 and 132, respectively, are heterojunctions.

However, the electroluminescent semiconductor device 110 of the second embodiment differs from the semiconductor device 10 in that the passive regions 122 each have three passive layers while the passive regions 22 each have only two passive layers. The passive regions 122 each include a first passive layer 140, extending from a portion of the first contacting surface 113 along the sloping side surface 125 and surface 123 of the substrate 118 and extending to a portion of the side surfaces 116, a second passive layer 142 is on the first passive layer 140 opposite the active region 120 and extends from a portion of the first contact surface 113 to a portion of the side surface 116, and a third passive layer 146 is on a surface of the second passive layer 142 opposite the first passive layer 140, and extends to the remaining portion of the first contact surface 113 and the remaining portion of the side surfaces 116. The first passive layer 140 and third passive layer 146 are of one conductivity type while the second passive layer 142 is of the opposite conductivity type. Consequently, the junctions 144 and 148 between the second passive layer 142 and each of the first and third passive layers 140 and 146 respectively, are P-N junctions. The passive region 122 is of a semiconductor material having the same properties as the semiconductor material of the passive region 22. Since the first, second and third passive layers 140, 142 and 146 are all of the same semiconductor material the P-N junctions 144 and 148 are homojunctions.

The first and second passive layers 140 and 142 function in the same manner in restricting the flow of current as do the first and second passive layers 40 and 42. The third passive layer 146 like the first and second passive layers 140 and 142 is of very low doping concentration so as to be less conductive to the flow of current then the active region 120. As previously stated, it is preferable that the first passive layer 140 be of N-type conductivity so as to form a Schottky barrier with the first metallic electrode 124, therefore, the second passive layer 142 is of P-type conductivity and the third passive layer 146 is of N-type conductivity, therefore also forming a Schottky barrier with the first electrode 124. In addition, with the active region 120 the same as the active region 20 the P-N junction 148, between the third passive layer 146 and the second passive layer 142, will be reversed biased when the P-N junction 134 is forward biased. The reverse biasing of the P-N junction 148 prevents the passage of current. If both the first and second passive layers 140 and 142 are very thin, i.e., in the range of 0.1 to 1.0 micron each, most of the current that may leak into the passive region 122 from the first metallic electrode 124 will flow into the third passive layer 146 and be blocked at the P-N junction 148.

The fabrication of the semiconductor device 110 is the same as that for the semiconductor device 10 except that the third passive layer 146 is grown on the second passive layer 142.

The passive regions 22 and 122 have been depicted in the first and second embodiments as having two and three contiguous layers, respectively. However, the passive regions of the electroluminescent semiconductor device of the present invention may include more than three passive layers. Generally speaking the passive regions of the present invention may comprise a plurality of contiguous layers each of which extends from a first contact surface to a side surface, as depicted in FIGS. 1 and 2, and each passive layer is of a conductivity type opposite to a contiguous passive layer, with the P-N junction therebetween extending from the first contact surface to the side surface of the body.

The side surfaces 25 and 125 of the active regions 20 and 120, respectively, have been discussed as being sloping, i.e., flaring out. However, it is anticipated that in the present invention the side surfaces 25 and 125 may extend substantially perpendicular, in the first embodiment, to both the first contact surface 13 and surface 23 of substrate 18, and in the second embodiment, to both the first contact surface 113 and surface 123 of substrate 118. In addition, the side surfaces of the active regions 25 and 125 may not begin to flare out at the first contact surface, but instead the side surfaces may begin to flare out at some distance from the first contact surface and continue to flare out toward the substrate surface.

The electroluminescent semiconductor devices 10 and 110 of the present invention provides devices wherein the flow of current is restricted to that portion of the device where electroluminescence is generated.

We claim:

1. An electroluminescent semiconductor device having restricted current flow comprising:
    a body of semiconductor material having opposed end surfaces, opposed side surfaces extending to said end surfaces, opposed first and second contact surfaces substantially perpendicular to said end surfaces and said side surfaces;
    said body having therein a substrate at said second contact surface having a surface opposite said second contact surface, an active region at least a portion of which is capable of generating electroluminescence, all of said active region being in the form of a mesa, said active region is on a portion of said opposite surface of said substrate and extends to said first contact surface, said active region having side surfaces which are spaced from said side surfaces of said body, and passive regions which extend from the side surfaces of said active region to said side surfaces of said body and said first contact surface, said passive regions having therein a P-N junction extending from said first contact surface to said side surface of said body.

2. The electroluminescent semiconductor device in accordance with claim 1 wherein said passive regions each comprises a plurality of contiguous passive layers each of which extends from a portion of said first contact surface to said side surface of said body, each of said passive layers is of a conductivity type opposite to a contiguous passive layer.

3. The electroluminescent semiconductor device in accordance with claim 2 further comprising a first metallic electrode on said first contact surface in contact with said active region and said passive regions, and a second metallic electrode on said second contact surface in contact with said substrate.

4. The electroluminescent semiconductor device in accordance with claim 3 wherein said active region includes a cap layer at the first contact surface and forming an ohmic contact with said first metallic electrode.

5. The electroluminescent semiconductor device in accordance with claim 4 wherein said passive regions each comprises:
    a first passive layer of one conductivity type in contact with both the side surface of said active region and the surface of said substrate, and extending from a portion of said first contact surface to a portion of the side surface of said body; and
    a second passive layer of an opposite conductivity type on said first passive layer, and extending to the remaining portion of said first contact surface and the remaining portion of the side surface of said body.

6. The electroluminescent semiconductor device in accordance with claim 5 wherein said first and second passive layers are of a semiconductor material having a doping concentration lower than that of the cap layer of said active region.

7. The electroluminescent semiconductor device in accordance with claim 6 wherein said first passive layer is of N-type conductivity forming a Schottky barrier with said first metallic electrode, and said second passive layer is of P-type conductivity.

8. The electroluminescent semiconductor device in accordance with claim 4 wherein said passive regions each comprises:
    a first passive layer of one conductivity type in contact with both the side surface of said active region and the surface of said substrate, and extending from a portion of said first contact surface to a portion of the side surface of said body;

a second passive layer is on said first passive layer opposite said active region, said second passive layer extending from a portion of said first contact surface to a portion of the side surface of said body; and a third passive layer of the same conductivity as said first passive layer is on a surface of said second passive layer opposite said first passive layer, said third passive layer extending to the remaining portion of said first contact surface and to the remaining portion of the side surface of said body.

9. The electroluminescent semiconductor device in accordance with claim 8 wherein said first, second and third passive layers are of a semiconductor material having a doping concentration lower than that of the cap layer of said active region.

10. The semiconductor device in accordance with claim 8 wherein said first and their passive layers are of N-type conductivity forming a Schottky barrier with said first metallic electrode, and said second passive layer is of P-type conductivity.

11. The electroluminescent semiconductor device in accordance with claim 1 wherein said side surfaces of said active region flare out as they extend from said first contact surface to said substrate surface.

* * * * *

UNITED STATES PATENT OFFICE
CERTIFICATE OF CORRECTION

PATENT NO. : 4,048,627
DATED : Sept. 13, 1977
INVENTOR(S) : Michael Ettenberg et al It is certified that error appears in the above-identified patent and that said Letters Patent are hereby corrected as shown below:

Claim 10, line 2    "their" should be -- third --.

Signed and Sealed this

Twenty-fourth Day of January 1978

[SEAL]

Attest:

RUTH C. MASON
*Attesting Officer*

LUTRELLE F. PARKER
*Acting Commissioner of Patents and Trademarks*